(12) United States Patent
Hwang et al.

(10) Patent No.: US 6,833,732 B2
(45) Date of Patent: Dec. 21, 2004

(54) OUTPUT SIGNAL CIRCUIT CAPABLE OF AUTOMATICALLY DETECTING POLARITY

(75) Inventors: Bar-Chung Hwang, Hsinchu (TW); Jin-Chyuan Fuh, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/358,169

(22) Filed: Feb. 5, 2003

(65) Prior Publication Data

US 2004/0150425 A1 Aug. 5, 2004

(51) Int. Cl.[7] .................. H03K 19/0175; H03L 7/00
(52) U.S. Cl. ................................... 326/82; 327/142
(58) Field of Search .................... 326/82; 327/142; 318/685; 363/17; 365/49; 375/292; 711/114, 115; 710/8

(56) References Cited

U.S. PATENT DOCUMENTS 5,257,287 A * 10/1993 Blumenthal et al. ........ 375/292
5,296,792 A * 3/1994 Knierim ..................... 318/685
5,357,624 A * 10/1994 Lavan ........................ 711/115
5,488,736 A * 1/1996 Keech et al. ............... 711/114
5,510,740 A * 4/1996 Farrell et al. ............... 327/142
6,473,316 B2 * 10/2002 Fujiyama et al. ............ 363/17
6,711,041 B2 * 3/2004 Pereira et al. ................ 365/49
6,762,632 B1 * 7/2004 Himpe et al. ............... 327/142

* cited by examiner

Primary Examiner—Patrick Wamsley
(74) Attorney, Agent, or Firm—Rosenberg, Klein & Lee

(57) ABSTRACT

The present invention proposes an output signal circuit capable of automatically detecting polarity, whose input/output signal terminal of the output signal circuit has both input and output functions. When a system undergoes a power on reset or a hardware reset, the output signal circuit can be shut off, and the input state of the input/output signal terminal is used to set the polarity of output signal. After reset, the pin is restored to its normal output. When an IC has the output signal capable of automatically detecting polarity, the flexibility in design of application circuits can be enhanced. Limitation of usage of IC due to fixed polarity of output signal can thus be avoided.

1 Claim, 5 Drawing Sheets

OUTPUT SIGNAL CIRCUIT CAPABLE OF AUTOMATICALLY DETECTING POLARITY

FIELD OF THE INVENTION

The present invention relates to an output signal circuit and, more particularly, to an output signal circuit capable of automatically detecting polarity to output signals with proper polarity.

BACKGROUND OF THE INVENTION

Some output signals are of active high drive, while some are of active low drive. The polarities of output signals are usually defined in the specification of each special integrated circuit (IC) by designers of the IC. FIG. 1 shows a circuit diagram having pins of input and output signals in the prior art. When a system undergoes a power on reset or a hardware reset and a system driver stays, the output signals will accept commands of the driver to reflect proper polarities and show exact states, which includes driving a LED indication lamp, or turning on or off the power of accessory circuits.

When the polarity of the output signals of a special IC is fixed, the flexibility of design of the IC in system application circuits (e.g., direct drive of simple small-current LED indication lamp, drive of relay, or drive of power of more complex accessory circuit) will be limited. When system designers take into account components, cost, layout, and materials, if the polarity of output signals of IC is fixed, opportunity of usage of the IC in some situations may be lost. Especially, in more complex drive modules, when the polarity of output signals of an IC is reversed, the IC cannot be used. An inverter must be added so that the IC can be used. However, this kind of way will increase the manufacturing cost of drive module and trouble in preparing materials for production.

Accordingly, the present invention aims to propose an output signal circuit capable of automatically detecting polarity.

SUMMARY OF THE INVENTION

The primary object of the present invention is to provide an output signal circuit capable of automatically detecting polarity, whose input/output signal terminals have input and output functions simultaneously. When a system undergoes a power on reset or a hardware reset, the output signal circuit can be temporarily shut off, and the logic state of the signal terminal can be imported. After reset and a driver stays in the IC, output signals with proper polarity will be outputted according to the driver's commands, thereby enhancing the flexibility of usage of the IC in various kinds of driver modules.

The various objects and advantages of the present invention will be more readily understood from the following detailed description when read in conjunction with the appended drawings, in which:

DETAILED DESCRIPTION OF THE PREFERRED EMBODIMENTS

Figure 1:
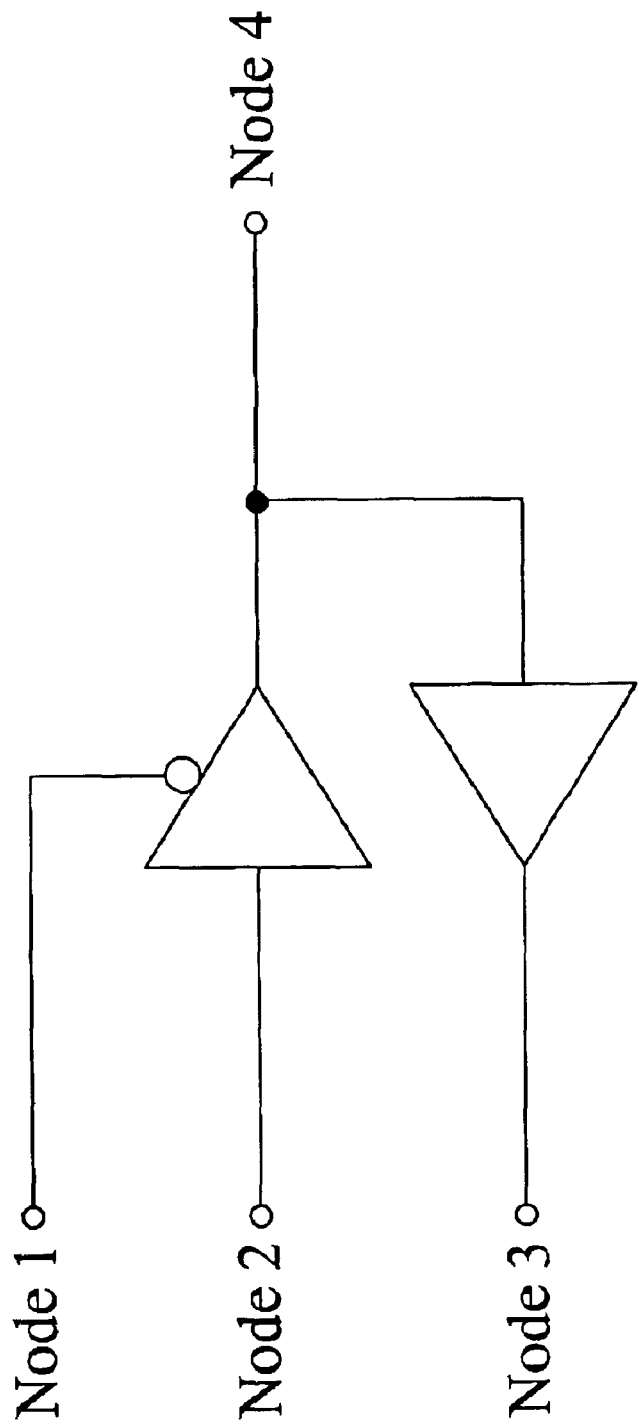
FIG. 1 is a circuit diagram having pins of input and output signals in the prior art.
Figure 2:
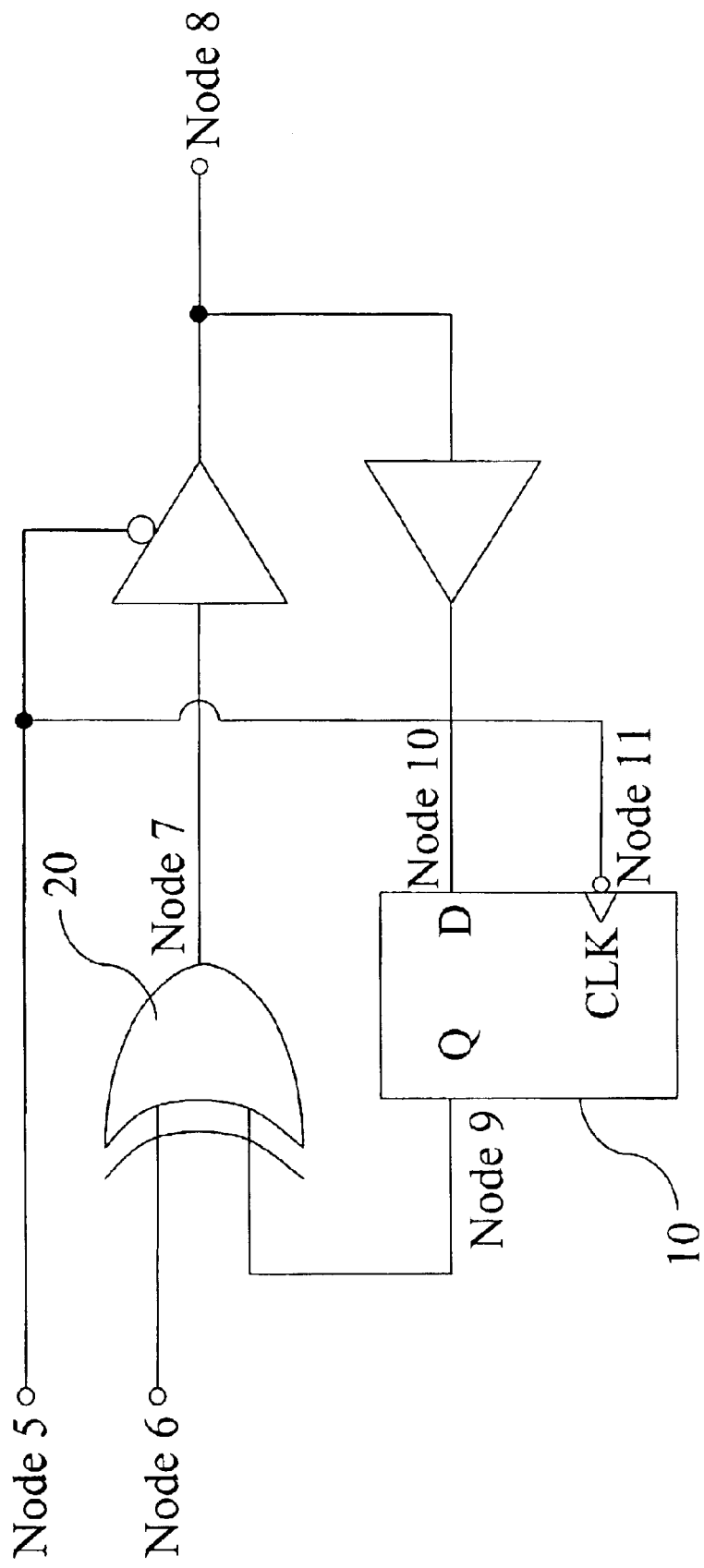
FIG. 2 is a diagram of the output signal circuit of the present invention.

The present invention proposes an output signal circuit capable of automatically detecting polarity input/output signal terminals of the output signal circuit have input and output characteristics, as shown in FIG. 2. FIGS. 3 to 8 show various kinds of application circuits of the output signal circuit of the present invention.

As shown in FIG. 2, an output signal circuit capable of automatically detecting polarity of the present invention comprises a reset terminal Node 5 of a system, a memory device, and a controller. The reset terminal Node 5 is connected to an external device via an input/output signal terminal Node 8. The memory device (e.g., a D-flip-flop 10) is respectively connected to the reset terminal Node 5 and the input/output signal terminal Node 8 via circuit lines. When receiving a reset command of the system, the memory device can automatically detect and memorize the connection potential polarity of the external device. The controller is usually a logic gate 20, whose input terminal can be connected respectively to the memory device and an output register (not shown) and whose output terminal is connected to the external device via the input/output signal terminal Node 8 so as to output to the signal output terminal of the input/output signal terminal Node 8 according to the status of the memory device and output state stored in the output register. The external device can be selected among small-signal circuit component, LED indication lamp, power switch of tributary circuit, relay, highly energy-consuming component, direct drive circuit, bipolar transistor current amplification drive circuit, metal-oxide-semiconductor transistor voltage-to-current drive circuit, and their combination.

When the above output register is active, the connection potential polarity of the external device is opposite to the input potential polarity finally outputted to the external device after reset. On the other hand, when the output register is inactive, the connection potential polarity of the external device is the same as the input potential polarity finally outputted to the external device after reset.

Figure 4:
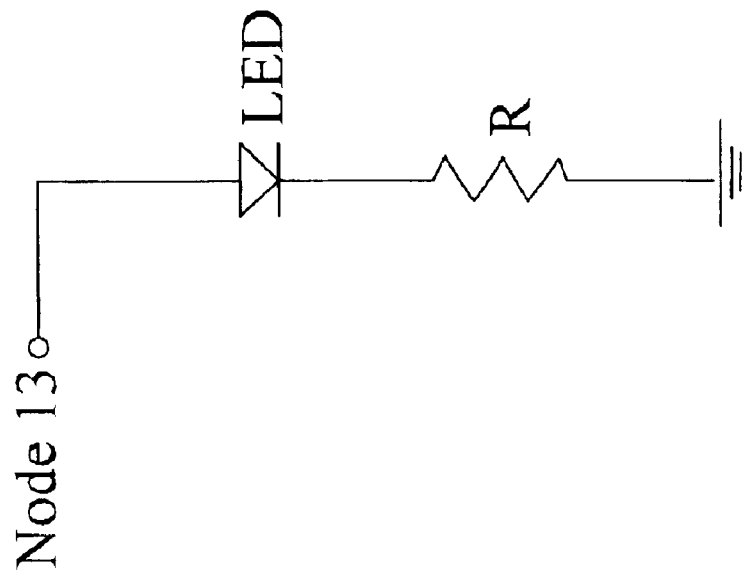
FIGS. 3 to 8 show various kinds of application circuits of the output signal circuit of the present invention.
Figure 3:
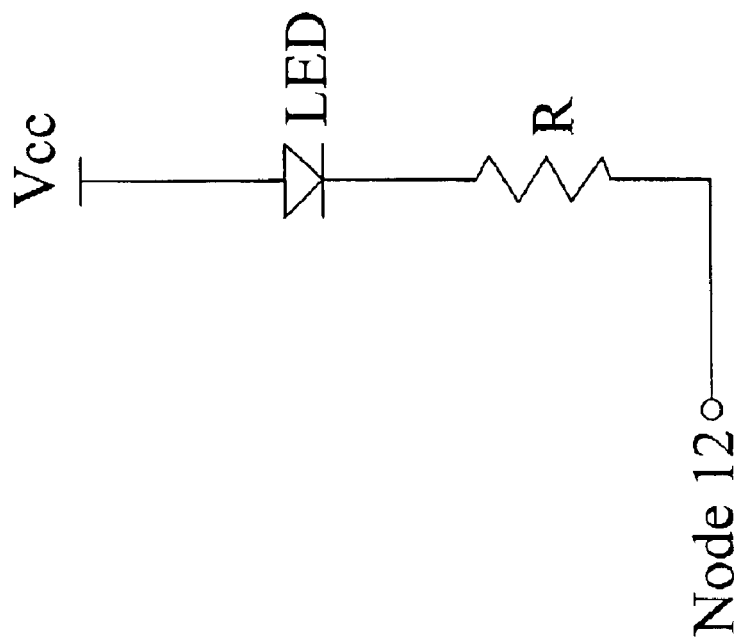

Usually, when the system undergoes a power on reset or a hardware reset, the output signals are at disable state, like turning out the LED indication lamp or turning off the accessory power. After the system drive stays in and controls the system, the output signals are changed to enable state depending on the circumstances, like turning on the LED indication lamp or the accessory power. FIGS. 3 and 4 show an example of usage of the circuit of the present invention in the above situations. In this example of usage, the circuit of the present invention, like the input/output signal terminal Node 8 in FIG. 2, will be connected respectively to a signal terminal Node 12 in FIG. 3 and a signal terminal Node 13 in FIG. 4 to drive LEDs in the two figures.

FIGS. 3 and 4 are possible application circuits of the present invention, which differ in that the LED indication lamp in FIG. 3 is turned on only when the signal terminal Node 12 is connected to the input/output signal terminal Node 8 and at a low state, while the LED indication lamp in FIG. 4 is turned on only when the signal terminal Node 13 is connected to the input/output signal terminal Node 8 and at a high state. In other words, after the system undergoes a power on reset or a hardware reset and the system driver stays in the system, the input/output signal terminal Node 8 of the present invention must respectively output opposite-polarity output signals to drive the LED indication lamps in the two examples of usage of the circuit.

Assume a REG-OUT terminal, Node 6 of the system, in FIG. 2 is the register output controlled by commands of a driver for the system, this output can be defined to be active high, i.e., writing in 1 means on, while writing in 0 means off. If this signal output circuit is adopted by the application circuit of FIG. 3, when a system reset is performed, the state of a reset terminal (RESET) Node 5 will be pulled high, which will let the input/output signal terminal Node 8 shut off output. At this time, the signal terminal Node 8 connected to the Node 12 will be pulled to a high potential state by a power source terminal Vcc, an LED, and a resistor component R in FIG. 3. This high potential state will also be transferred to a D point Node 10 of the D-flip-flop 10. After reset, the reset terminal Node 5 will jump back to a low potential state of 0 to trigger a CLK point Node 11 of the D-flip-flop 10 so as to transfer the potential state of the D point Node 10 to a Q point Node 9, thereby locking the Q point Node 9 to let it be at a high potential state (i.e., 1). At this time, the REG-OUT terminal Node 6 will be at off state (i.e., 0) because the system is reset and the driver does not stay in yet. This state will be transferred to the input terminal of an exclusive OR gate 20 to let an output terminal Node 7 thereof output a high potential state representing 1. Because the Node 5 jumps back to a low potential state after reset, the high potential state of the Node 7 will be outputted to the signal terminal of the Node 8 to let the Node 8 maintain a high potential. Therefore, after reset and before the driver stays in, the pin Node 12 will still maintain a high potential to keep the LED indication lamp at off state. After the driver stays in, the Node 6 will be written in 1, and the output terminal Node 7 of the exclusive Or gate 20 jumps back to a low potential to change the potential state of the input/output signal terminal Node 8 (i.e., the signal terminal Node 12) to low. At this time, the LED indication lamp will be turned on.

In the example of usage of a drive circuit having opposite polarity of output signals, when a system reset is performed, the input/output signal terminal Node 8 connected to the signal terminal Node 13 will be pulled to a ground low potential state by the LED and the resistor component R. This low potential state will be transferred to the D point Node 10 of the D-flip-flop 10. After reset, the Node 5 will jump back to a low potential state to trigger the CLK point Node 11 of the D-flip-flop 10 and transfer the potential state of the D point Node 10 to the Q pint Node 9, thereby locking the Q point Node 9 to let it be at a low potential state (i.e., 0). At this time, the REG-OUT terminal Node 6 will be at off state (i.e., 0) because the system is reset and the driver does not stay in yet. This state will be transferred to the input terminal of the exclusive OR gate 20 to let the output terminal Node 7 thereof output a low potential state representing 0. Because the Node 5 jumps back to a low potential state representing 0 after reset, the low potential state of the Node 7 will be outputted to the signal terminal of the Node 8 to let the Node 8 maintain a low potential. Therefore, after reset and before the driver stays in, the signal terminal Node 13 will still maintain a low potential to keep the LED indication lamp at off state. After the driver stays in, the Node 6 will be written in 1, and the output terminal Node 7 of the exclusive OR gate 20 will be pulled to a high potential to change the potential state of the input/output signal terminal Node 8 (i.e., the Node 13) to high. At this time, the LED indication lamp will be turned on.

As can be seen from the above examples of usage in FIGS. 3 and 4, the circuit of the present invention can automatically detect polarity to respectively output opposite-polarity output signals so as to turn on the LED indication lamps in the two examples usage of the circuit.

Figure 6:
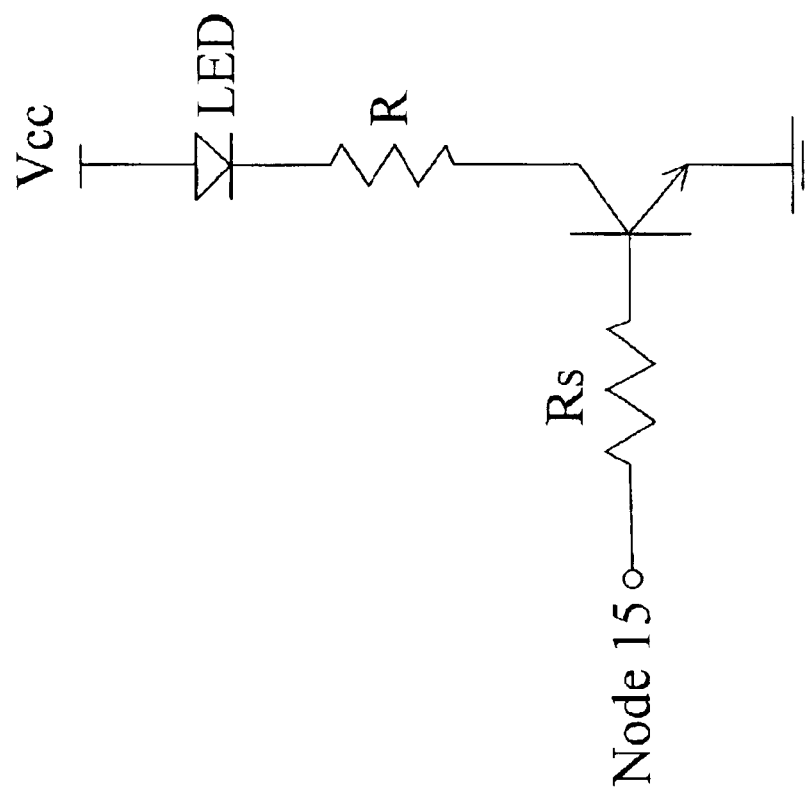
Figure 5:
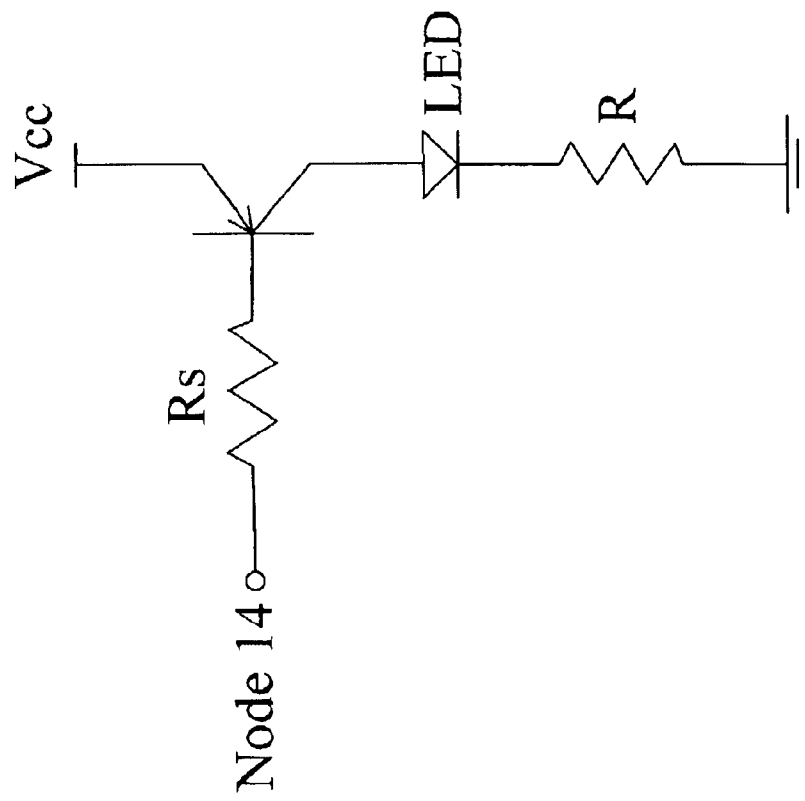

In FIGS. 3 and 4, we assume that the output signal pins of the circuit of the present invention can provide sufficient sink-in currents or sufficient drive currents to turn on the LED indication lamps in the figures. If the sink-in or drive current of the output signal pin is not enough, a PNP transistor current amplification circuit or an NPN transistor current amplification circuit can be used to drive the LED indication lamp, as shown in FIG. 5 or FIG. 6.

FIGS. 3 to 6 show examples of usage of the output signal circuit capable of automatically detecting polarity of the present invention in current drive circuits, wherein it is assumed that there is sufficient current to let the output signal pin be pulled to a Vcc high potential or a ground low potential when the system is reset.

Figure 7:
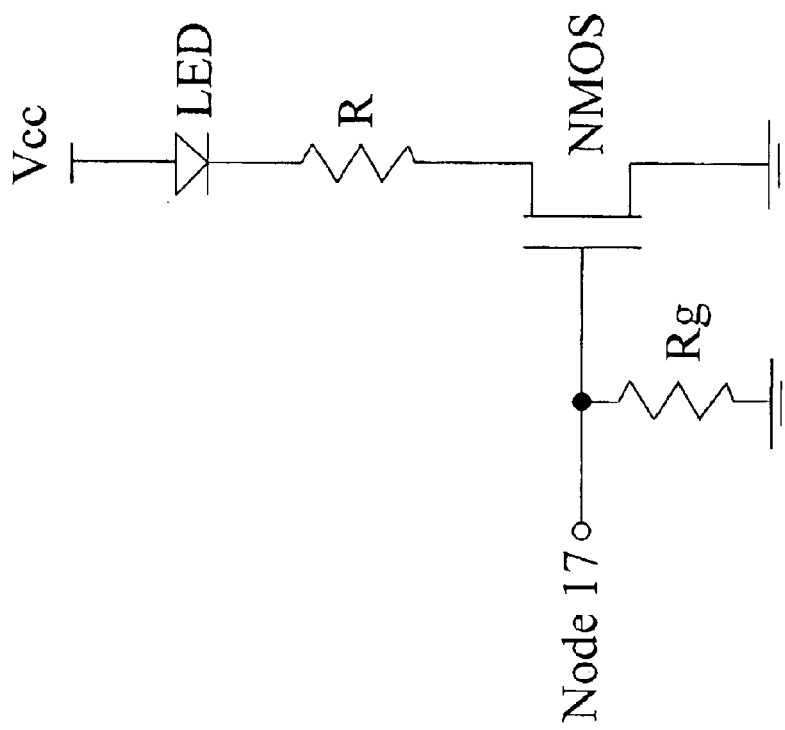
Figure 8:
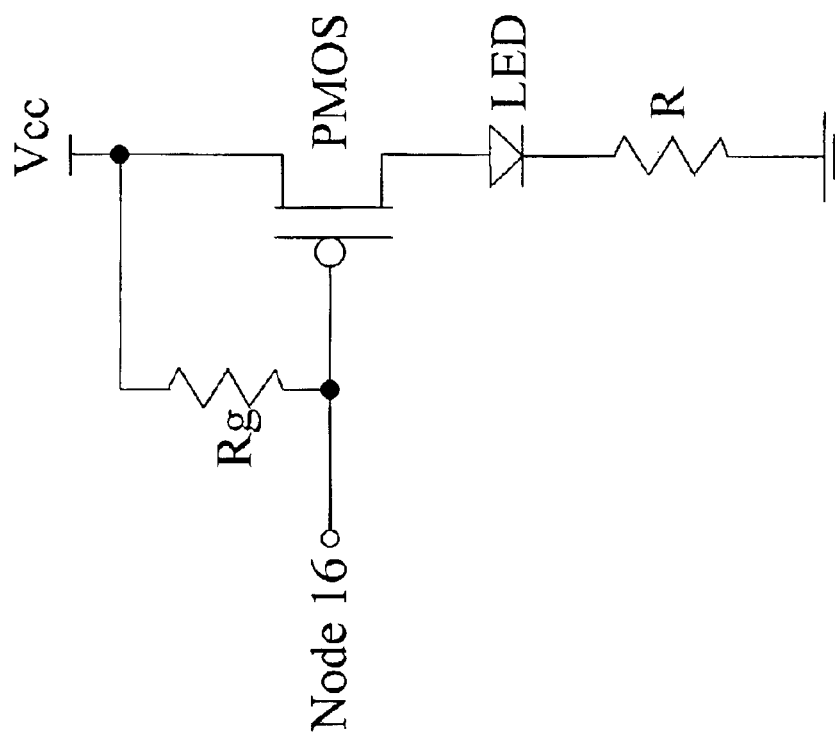

If the output signal circuit capable of automatically detecting polarity of the present invention applies to drive circuits utilizing MOS transistor voltage drive components like PMOS or NMOS, when the system is reset, because the output signal pin is at a high impedance state, a resistor Rg must be added to the Vcc end in FIG. 7 or the ground end in FIG. 8 so that the circuit of the present invention can normally operate.

In the examples of usage in FIGS. 5 to 8, the circuit can obtain a higher drive current. The load resistors represented by the LED indication lamp and the resistor R can be replaced with relays or other components dissipating more energy. Additionally, for more complex drive modules whose control signals are of voltage drive, pull high of the Rg state in FIG. 7 or pull low of the Rg state in FIG. 8 is essential.

The power on reset command or the hardware reset command in the above embodiments can be active high or active low.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. An output signal circuit interposed between a system and an external device and being capable of automatically detecting polarity, comprising:

an input/output signal circuit having a first output terminal connected to the external device, the external device being enabled by either one of an active-high or an active-low logic signal output, said input/output signal circuit including a reset terminal connected to a reset node of the system for disabling said first output terminal responsive to a reset command signal input from the reset node, said input/output signal circuit having a second output terminal providing a logic signal corresponding to a quiescent potential of the external device when said first output terminal is disabled;

a memory device having a clock input terminal coupled to said reset terminal and an input terminal connected to said second output terminal of said input/output signal circuit, said memory device storing said logic signal corresponding to the quiescent potential and providing said stored logic signal to an output terminal thereof responsive to a logic level transition of said reset command signal input to said clock input terminal; and an exclusive-or sate having a first input terminal connected to said output terminal of said memory device and a second input terminal coupled to an output node of the system, said exclusive-or gate having an output terminal coupled to an input terminal of said input/output signal circuit for coupling to said first output terminal of said input/output signal circuit, wherein the external device is disabled responsive to the reset command signal and subsequently enabled responsive to an enable signal from the output node of the system irrespective of whether the external device is enabled by an active-high or an active-low logic signal.

* * * * *